US009893198B2

(12) United States Patent
Fang et al.

(10) Patent No.: US 9,893,198 B2
(45) Date of Patent: Feb. 13, 2018

(54) THIN FILM TRANSISTOR UTILIZED IN ARRAY SUBSTRATE AND MANUFACTURING METHOD THEREOF

(71) Applicant: HON HAI PRECISION INDUSTRY CO., LTD., New Taipei (TW)

(72) Inventors: Kuo-Lung Fang, Hsinchu (TW); Yi-Chun Kao, Hsinchu (TW); Hsin-Hua Lin, Hsinchu (TW); Po-Li Shih, Hsinchu (TW); Chih-Lung Lee, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/788,251

(22) Filed: Jun. 30, 2015

(65) Prior Publication Data

US 2016/0343865 A1 Nov. 24, 2016

(30) Foreign Application Priority Data

May 22, 2015 (TW) ............................ 104116578 A

(51) Int. Cl.

*H01L 29/786* (2006.01)
*H01L 27/12* (2006.01)
*H01L 29/06* (2006.01)
*H01L 29/66* (2006.01)

(52) U.S. Cl.

CPC ...... *H01L 29/7869* (2013.01); *H01L 27/1222* (2013.01); *H01L 29/0649* (2013.01); *H01L 29/66969* (2013.01); *H01L 29/78696* (2013.01)

(58) Field of Classification Search

CPC .......... H01L 29/7869; H01L 29/66742; H01L 27/1222; H01L 29/786–29/78696; H01L 29/0649

See application file for complete search history.

(56) References Cited

U.S. PATENT DOCUMENTS

2010/0304528 A1* 12/2010 Kim .................. H01L 21/02554 438/104
2012/0223301 A1* 9/2012 Ueda ................ H01L 29/78606 257/43
2016/0027904 A1* 1/2016 Lv ..................... H01L 21/02565 438/104

FOREIGN PATENT DOCUMENTS

CN 104007869 A 8/2014

* cited by examiner

*Primary Examiner* — Lauren R Bell
(74) *Attorney, Agent, or Firm* — ScienBiziP, P.C.

(57) ABSTRACT

A method for manufacturing a thin film transistor (TFT) which includes a gate, a gate insulation layer, a channel layer, an etching stopping layer, a source, and a drain. The gate is formed on a substrate. The gate insulation layer covers the gate and the substrate. The channel layer is formed on the gate insulation layer to correspond with the gate. The etching stopping layer is formed on a surface of the channel layer. The channel layer and the etching stopping layer are formed in a same photo etching process.

13 Claims, 13 Drawing Sheets

THIN FILM TRANSISTOR UTILIZED IN ARRAY SUBSTRATE AND MANUFACTURING METHOD THEREOF

CROSS-REFERENCE TO RELATED APPLICATIONS

This application claims priority to Taiwanese Patent Application No. 104116578 filed on May 22, 2015, the contents of which are incorporated by reference herein.

FIELD

The subject matter herein generally relates to a thin film transistor (TFT) and a manufacturing method of the TFT.

BACKGROUND

Thin film transistors (TFTs) are widely used in electronic devices, such as liquid display panels (LCDs), to serve as a switch component. Generally, a TFT can include a gate, a source, a drain, and a channel layer coupling the source to the drain. Metal oxide are widely used to form the channel layer because it's good characteristics (such as good conductivity and high electron mobility). Usually, an etching stopping layer (ESL) is utilized in the TFT to protect the channel layer.

BRIEF DESCRIPTION OF THE DRAWINGS

Implementations of the present technology will now be described, by way of example only, with reference to the attached figures.

DETAILED DESCRIPTION

Figure 1:
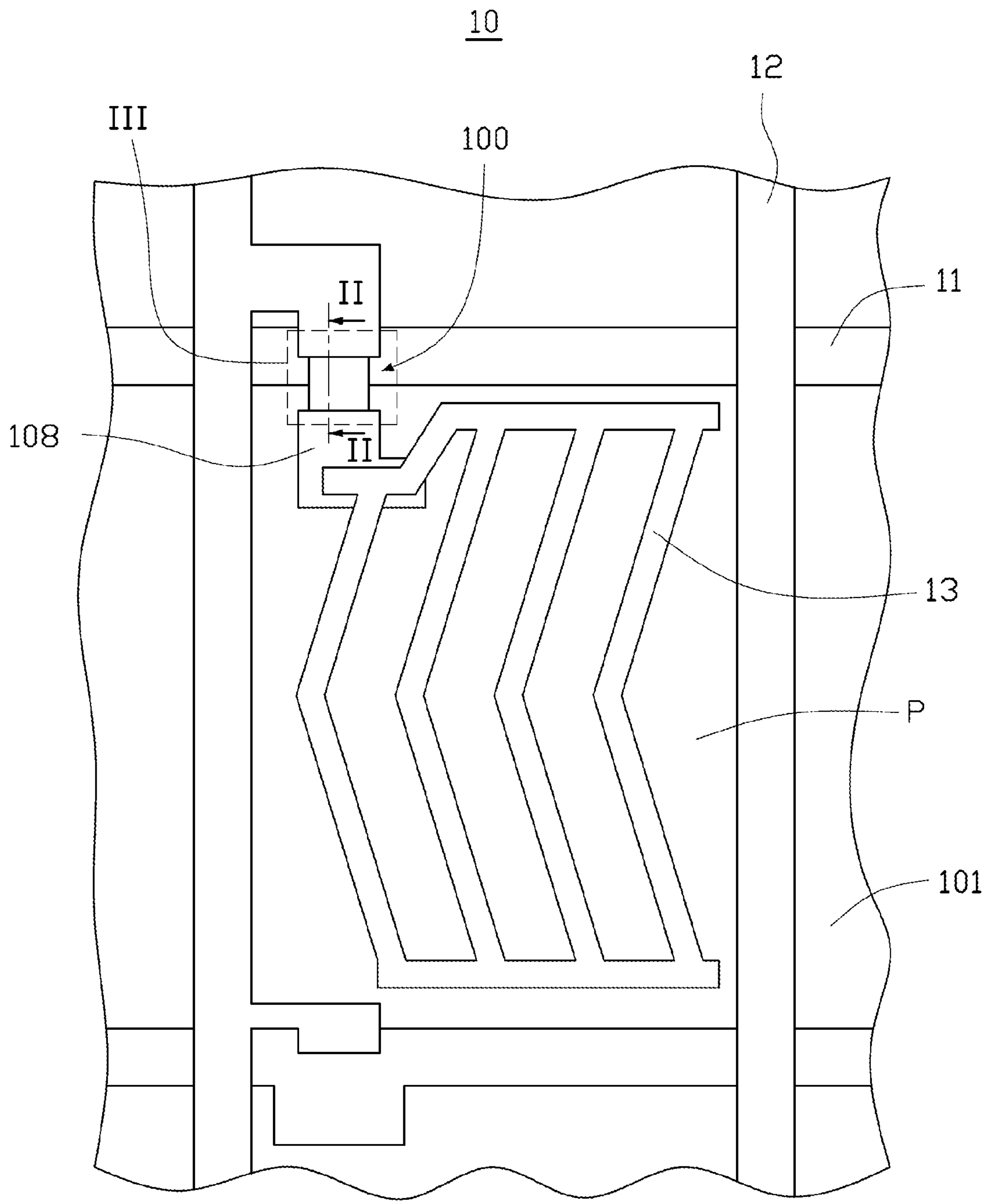
FIG. 1 is a diagrammatic view of a pixel area of an array substrate having thin film transistors (TFT).

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "comprising", when utilized, means "including, but not necessarily limited to"; it specifically indicates open-ended inclusion or membership in the so-described combination, group, series and the like.

The present disclosure is described in relation to a thin film transistor (TFT) utilized in an array substrate and a manufacturing method of the TFT.

FIG. 1 illustrates a diagrammatic view of a pixel area of an array substrate 10. The array substrate 10 includes a plurality of gate lines 11, a plurality of data lines 12, and a plurality of TFTs 100, and a plurality of pixel electrodes 13. The gate lines 11 and the data lines 12 are intersected with each other to define a plurality of pixels areas P. In at least one embodiment, the gate lines 11 are arranged in parallel, and the data lines 12 are arrange in parallel as well as the gate lines 11. The gate lines 11 extend along a first direction while the data lines 12 extend along a second direction perpendicular with the first direction. Thus, the pixel area P is rectangular. Each pixel electrode 13 is located within a corresponding pixel area P and is electrically coupled to corresponding TFT 100. The pixel electrode 13 can be made of transparent materials, such as indium tin oxide (ITO).

Figure 2:
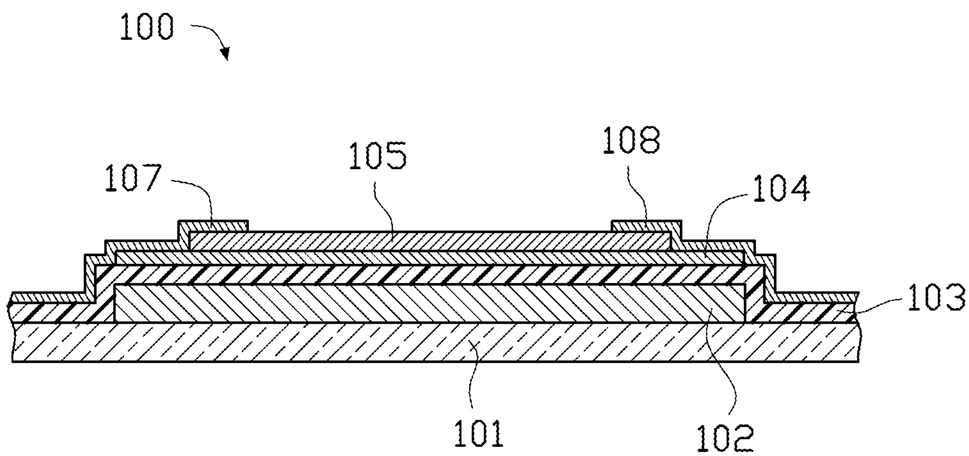
FIG. 2 illustrates a cross-sectional view of the TFT of FIG. 1 taken along line II-II of FIG. 1.
Figure 3:
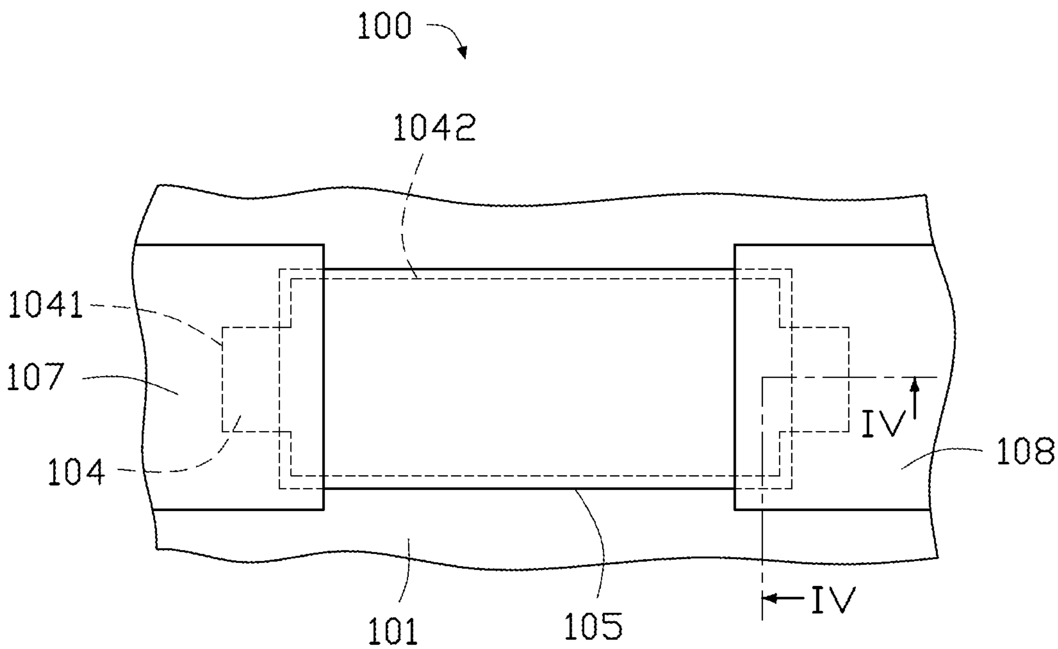
FIG. 3 illustrates a an enlarged view of an region III of FIG. 1.
Figure 4:
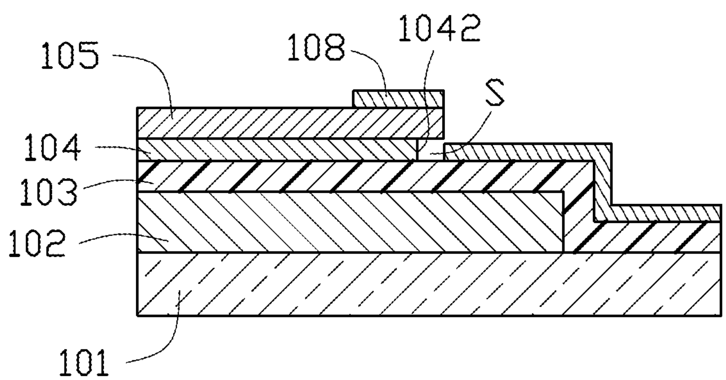
FIG. 4 illustrates a cross-sectional view taken along line IV-IV of FIG. 3.

Referring to FIG. 2 to FIG. 4, FIG. 2 illustrates a cross-sectional view of the TFT of FIG. 1 taken along line II-II, FIG. 3 illustratesa an enlarged view of an region III of FIG. 1, FIG. 4 illustrates a cross-sectional view taken along line IV-IV of FIG. 3. The TFT 100 includes a substrate 101, a gate 102, a gate insulation layer 103, a channel layer 104, an etching stopping layer (ESL) 105, a source 107, and a drain 108. The gate 102 is located on the substrate 101. The gate insulation layer 103 is located on and covers the substrate 101 and the gate 102. The channel layer 104 is located on the gate insulation layer 103 and corresponds with the gate 102. Thus, the channel layer 104 is isolated and separated from the gate 102 by the gate insulation layer 103. The gate 102 is electrically coupled to a corresponding gate line 11, the source 107 is electronically coupled to a corresponding data line 12, and the drain 108 is electrically coupled to a corresponding pixel electrode 13.

The source 107 and the drain 108 are respectively located at opposite sides of the channel layer 104 and coupled with the channel layer 104. The etching stopping layer 105 is located at a surface of the channel layer 104 adjacent to the source 107 and drain 108 to separate the source 107 and the drain 108 from each other. The etching stopping layer 105 can be made of transparent organic materials with light sensitivity performance. The etching stopping layer 105 is configured to prevent the channel layer 104 from being damaged in the etching process for making the source 107 and the drain 108. A thickness of the etching stopping layer 105 is about one micrometer. The channel layer 104 can be made of metal oxides, such as indium gallium zinc oxide (IGZO), indium zinc oxide (IZO), gallium zinc oxide (GZO), zinc tin oxide (ZTO), or zinc oxide (ZnO), or other like materials. The substrate 101 can be made of rigid and transparent inorganic materials, such as glass, quartz, or other like materials. In other embodiments, the substrate 101 can also be made of flexible organic materials, such as plastics, rubbers, polyesters, or other like materials The channel layer 104 includes two opposite first sides 1041 and two opposite second sides 1042. The first sides 1041 respectively extend to the source 107 and the drain 108 and respectively coupled with the source 107 and the drain 108. The first sides 1041 are not covered by the etching stopping layer 105. The second sides 1042 are covered by the etching stopping layer 105 and they are not coupled with the source 107 and the drain 108. A space S is defined between each of the second sides 1042 and a corresponding edge of the etching stopping layer 105. Thus, the two second sides 1042 are respectively separated from the source 107 and the drain 108. In this embodiment, the channel layer 104 and the etching stopping layer 105 can be formed in a same photo etching process In other embodiments, a flat layer (not shown) can be formed on the TFT 100 to protect the TFT 100. The materials of the flat layer can be filled into the space S, thereby increasing the strength of the TFT 100.

When a voltage is applied to the gate 102 via the gate line 11, the TFT 100 is turned on. At this time, the source 107 receives data signals from an external controller and the data signal signals are transmitted to the pixel electrode 13 via the drain 10, to realize a display function of a display device which utilizes the array substrate 10.

Figure 12:
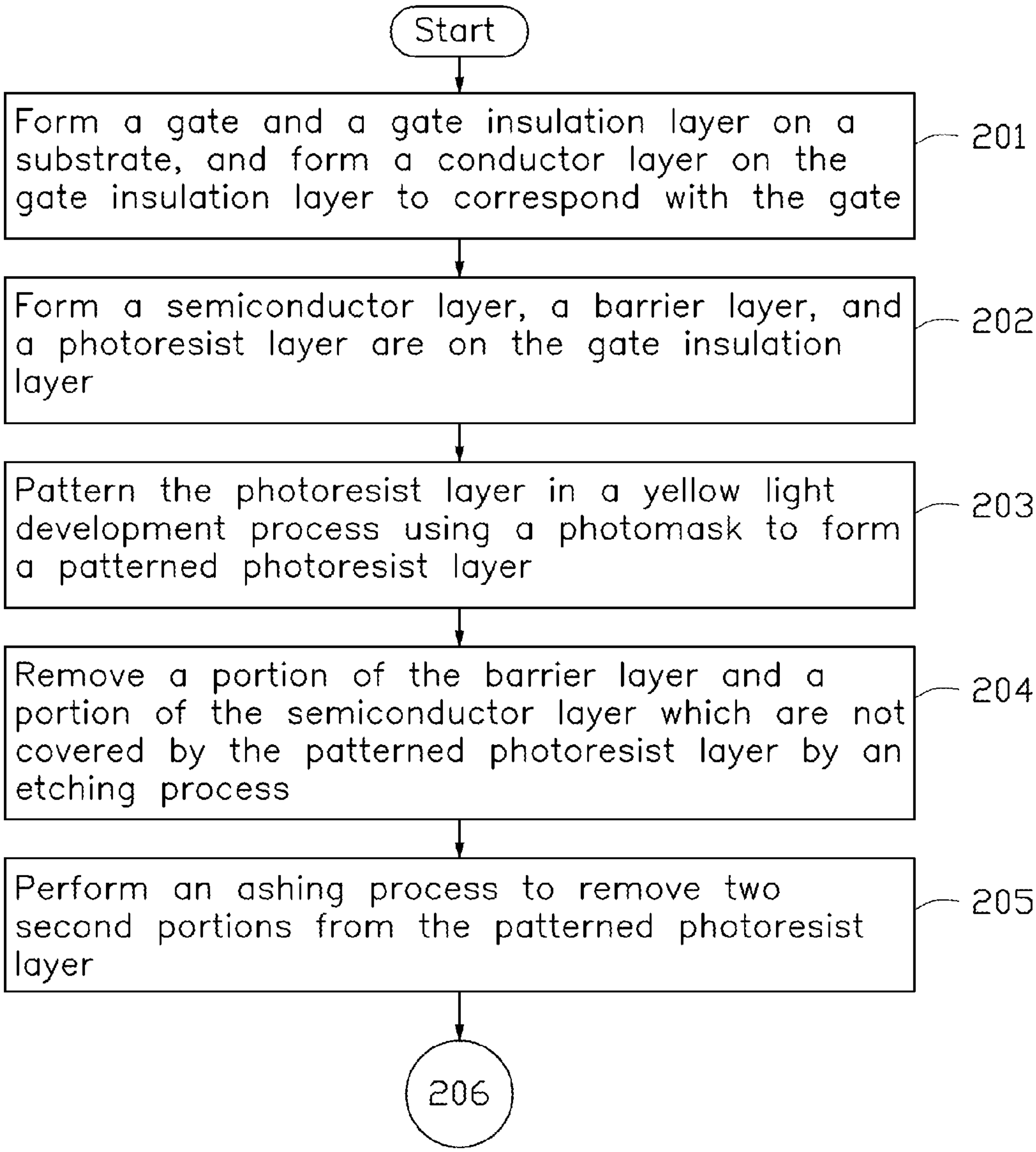
FIG. 12 and FIG. 13 illustrate a flowchart of a method for manufacturing the TFT of FIG. 2.
Figure 13:
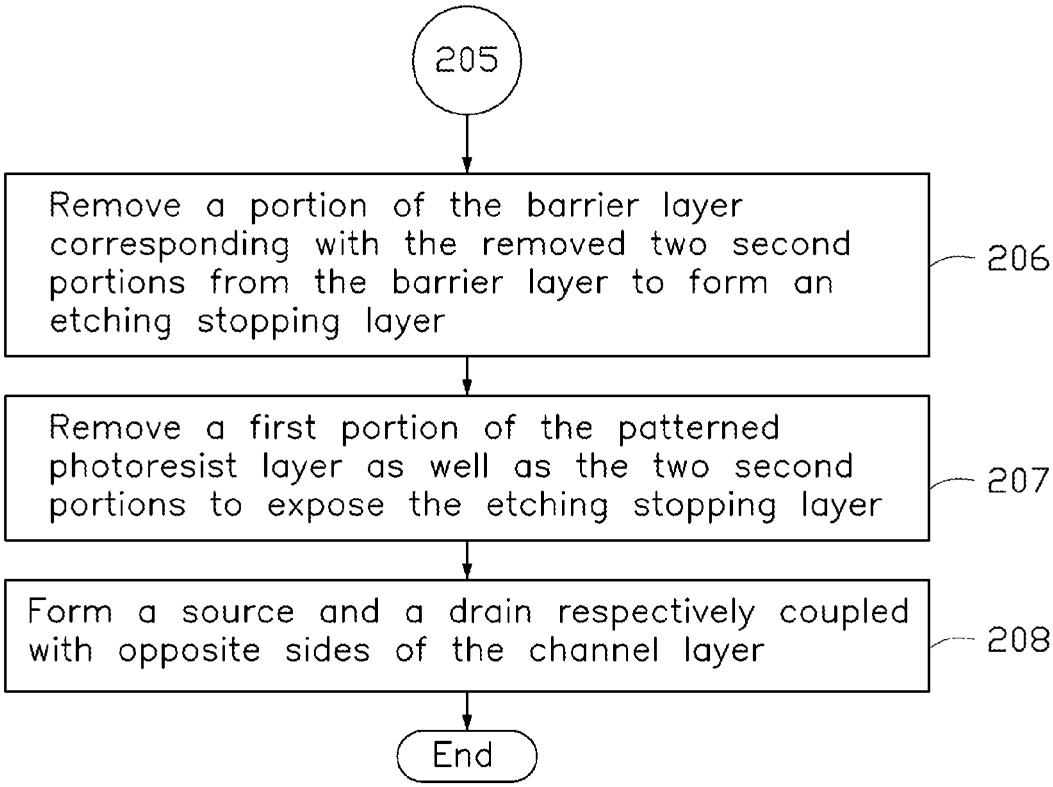

FIG. 12 and FIG. 13 illustrate a flowchart of method for manufacturing the TFT 100 of FIG. 2. The method is provided by way of example, as there are a variety of ways to carry out the method. Each block shown in FIG. 12 and FIG. 13 represents one or more processes, methods, or subroutines which are carried out in the example method. Furthermore, the order of blocks is illustrative only and the order of the blocks can change. Additional blocks can be added or fewer blocks may be utilized without departing from the scope of this disclosure. The example method can begin at block 201.

Figure 5:
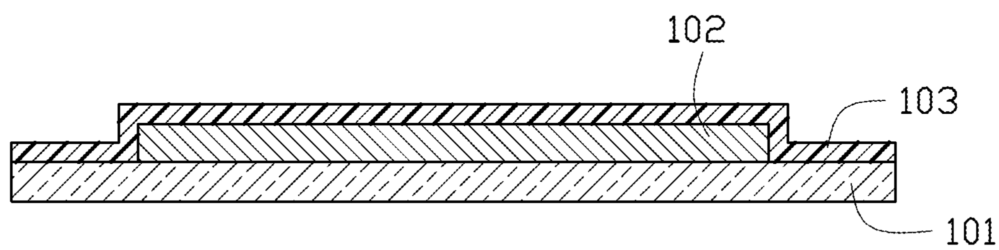
FIG. 5 illustrates a diagrammatic view of a gate and a gate insulation layer are formed on a substrate in a method for manufacturing the TFT of FIG. 2.

At block 201, referring to FIG. 5, a gate 102 and a gate insulation layer 103 are formed on a substrate 101 in that order.

In at least one embodiment, a first conductive material layer is coated on the substrate 101 and is patterned to form the gate 102 on the substrate 101. The first conductive material layer can be patterned using a photo etching process (PEP). The first conductive material layer can use metal materials, metal alloy materials, or metal oxide materials. The substrate 101 can be a transparent substrate such as a glass substrate, a quartz substrate, a flexible substrate. In other embodiment, the substrate 101 can be a non-transparent substrate or a translucent substrate.

When the gate 102 is formed on the substrate 101, a layer of insulation materials is coated on the gate 102 and the substrate 101 to form the gate insulation layer 103. The gate insulation layer 103 can be made of inorganic materials such as silicon nitride (SiNx) and silicon oxide (SiOx). The method for forming the gate insulation layer 103 can be a plasma chemical vapor deposition (PCVD) method.

Figure 6:
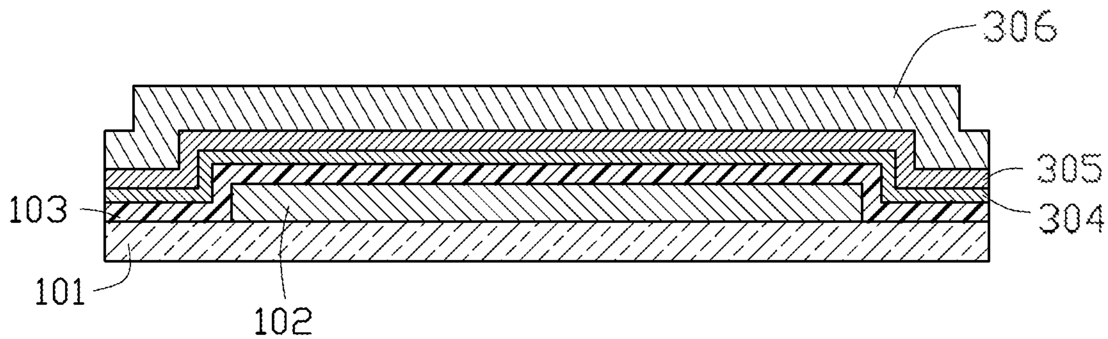
FIG. 6 illustrates a diagrammatic view of a semiconductor layer', a barrier layer', and a photoresist layer are formed on the gate insulation layer.

At block 202, as shown in FIG. 6, a semiconductor layer 304, a barrier layer 305, and a photoresist layer 306 are formed on the gate insulation layer 103 in that order. The semiconductor layer 304 can be formed using oxidized semiconductive materials, such as IGZO, ZTO, and ZnO. The barrier layer 305 can be formed using transparent organic materials. The photoresist layer 306 can be formed using photoresist materials.

Figure 7:
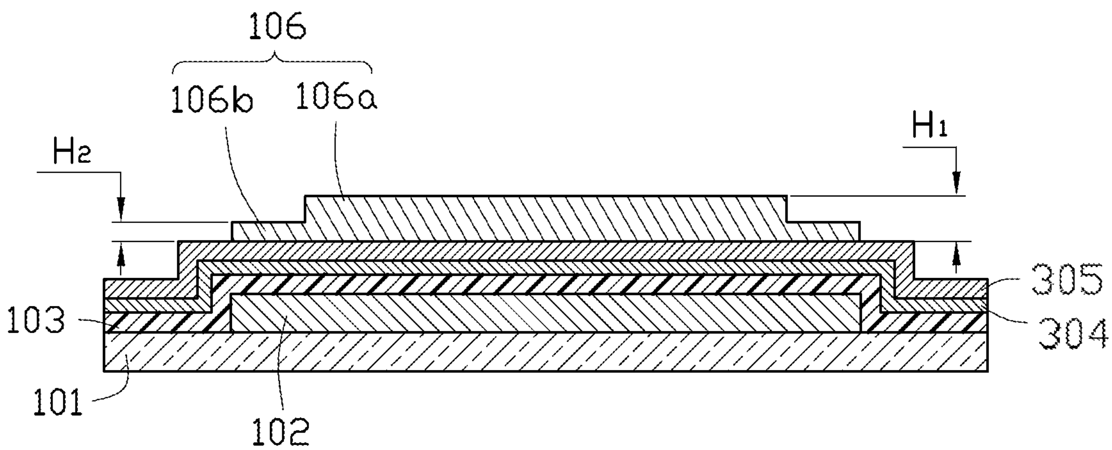
FIG. 7 illustrates a diagrammatic view of the photoresist layer of FIG. 6 is patterned to form a patterned photoresist layer having a first portion and two second portion.

At block 203, as shown in FIG. 7, the photoresist layer 306 is patterned in a yellow light development process using a photomask to form a patterned photoresist layer 106. Two opposite sides of the barrier layer 305 are exposed out of the patterned photoresist layer 106. In this embodiment, the patterned photoresist layer 106 includes a first portion **106*a* and two second portions 106*b* coupled together. The two second portions 106*b* are coupled at opposite sides of the first portion 106*a*. In at least one embodiment, a thickness of the first portion 106*a* is different from a thickness of each second portion 106*b*. Thus, the first portion 106*a* and the two second portions 106*b* corporately form a step pattern. In this embodiment, the thickness of the first portion 106*a* is greater than the thickness of the second portion 106*b*. In addition, in order to form the patterned photoresist layer 106, the photomask can be a grey-tone mask or a halftone mask. It is understood that, when the photomask is the halftone mask, the thickness of the first portion 106*a* is about two times the thickness of the second portion 106*b***.

Figure 8:
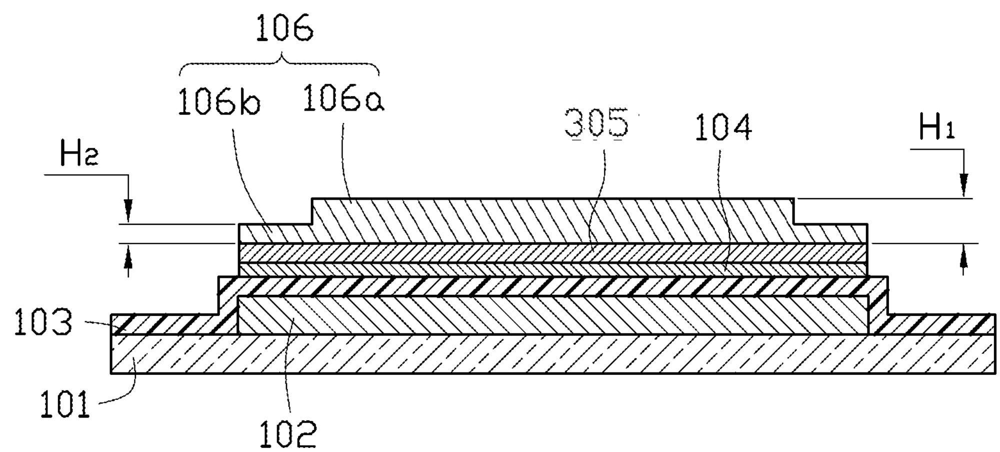
FIG. 8 illustrates a diagrammatic view of a portion of the barrier layer and a portion of the semiconductor layer which are not covered by the patterned photoresist layer are removed.

At block 204, as shown in FIG. 8, a portion of the barrier layer 305 and a portion of the semiconductor layer 304 which are not covered by the patterned photoresist layer 106 are removed in a same etching process. The other portion of the semiconductor layer 304 under the barrier layer 305 which is not removed from the etching process serves as the channel layer 104 of the TFT 100.

Figure 9:
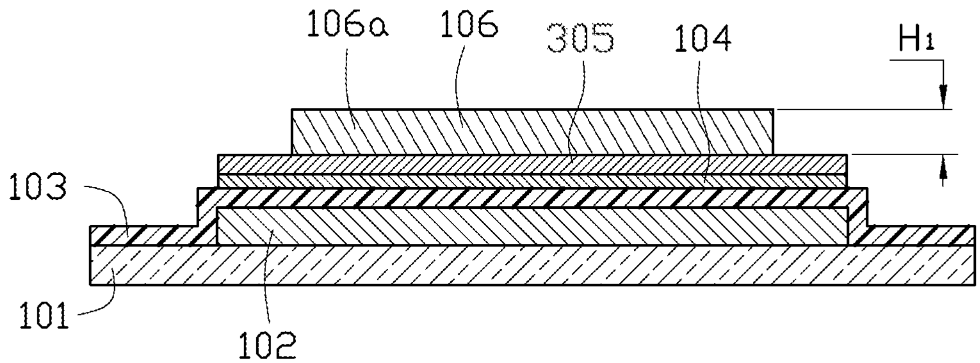
FIG. 9 illustrates a diagrammatic view of the two second portions of the patterned photoresist layer are removed therefrom.

At block 205, as shown FIG. 9, an ashing process is performed to remove the two second portions **106*b* from the patterned photoresist layer 106, thereby exposing opposite sides of the barrier layer 305 which are not etched by the etching process. In at least one embodiment, the ashing process can employ oxygen or ozone to remove the two second portions 106*b* from the patterned photoresist layer 106**.

Figure 10:
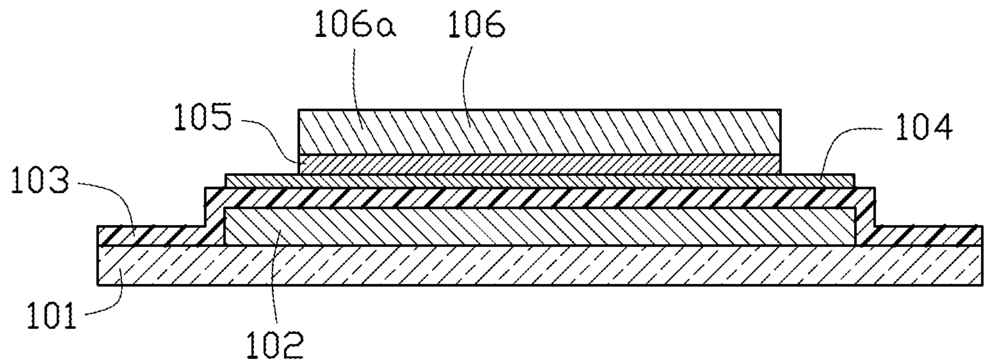
FIG. 10 illustrates a diagrammatic view of a portion of the barrier layer corresponding with the removed two second portions is removed from the barrier layer to form an etching stopping layer.

At block 206, as shown in FIG. 10, a portion of the barrier layer 305 corresponding with the removed two second portions **106*b* is removed from the barrier layer 305 to form the etching stopping layer 105, thereby exposing a portion of the channel layer 104**.

Figure 11:
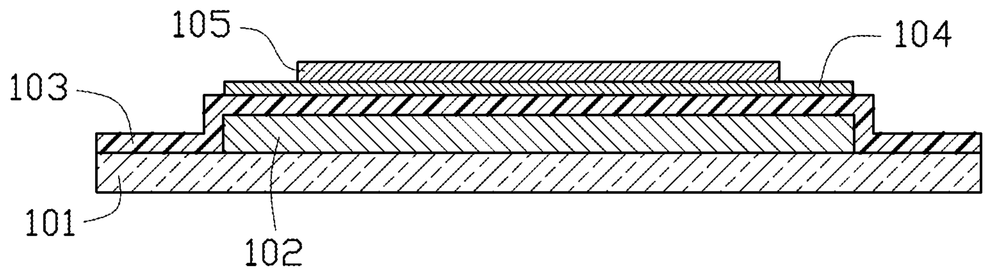
FIG. 11 illustrates a diagrammatic view of the first portion of the patterned photoresist layer is removed to expose the etching stopping layer.

At block 207, as shown in FIG. 11, the first portion **106*a* of the patterned photoresist layer 106 is removed as well as the two second portions 106*b*, to expose the etching stopping layer 105**.

At block 208, a source 107 and a drain 108 are respectively formed to couple with opposite sides of the channel layer 104, thereby forming a TFT 100 as shown in FIG. 2. In at least one embodiment, a second conductive material layer can be coated to cover the etching stopping layer 105, the channel layer 104, and the gate insulation layer 103. Then, the second conductive material layer can be patterned using a photo etching process to form the source 107 and the drain 108. The second conductive material layer can using the same materials with the first conductive material layer. In this embodiment, the source 107 and the drain 108 are respectively located at opposite sides of the channel layer 104 and are respectively contacted with the gate insulation layer 103 and the etching stopping layer 105.

As described above, the etching stopping layer 105 and the channel layer 104 can be formed in a same photo etching process. Therefore, the manufacturing cost of the TFT 100 can be decreased.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A method for manufacturing a thin film transistor (TFT) comprising:

forming a gate on a substrate;

forming a gate insulation layer on the substrate to cover the gate;

forming a semiconductor layer and a barrier layer on the gate insulation layer;

forming a patterned photoresist layer in a pattern on the gate insulation layer, the patterned photoresist layer comprising a first portion and at least two second portions coupled at opposite sides of the first portion on the gate insulation layer, wherein a thickness of the first portion is different from a thickness of each of the at least two second portions;

etching the barrier layer and the semiconductor layer to remove a first portion of the barrier layer not covered by the patterned photoresist layer and a portion of the semiconductor layer not covered by the patterned photoresist layer to form a channel layer under the barrier layer;

removing the at least two second portions of the patterned photoresist layer to expose a second portion of the barrier layer; and removing the second portion of the barrier layer to form an etching stopping layer, thereby exposing a portion of the channel layer;

removing the first portion of the patterned photoresist layer; and forming a source and drain coupled to the channel layer;

wherein the etching stopping layer is formed on a surface of the channel layer, the channel layer comprises two first sides, each of the two first sides located opposite each other, and two second sides, each of the two second sides located opposite each other;

wherein each of the two first sides connects between the two second sides; wherein the two first sides couple with the source and the drain, respectively; and wherein the two first sides are not covered by the etching stopping layer, and the two second sides are covered by the etching stopping layer; and an unfilled space is defined at each of the two second sides, each of the unfilled spaces is defined by one of the two second sides, a corresponding edge of the etching stopping layer, and a corresponding one of the source and the drain.

2. The method according to claim 1, wherein the photoresist layer is patterned in a yellow light development process using a photomask to form the patterned photoresist layer.

3. The method according to claim 2, wherein the photomask is a grey-tone mask.

4. The method according to claim 3, wherein the thickness of the first portion is greater than the thickness of each of the second portions.

5. The method according to claim 2, wherein the photomask is a halftone mask.

6. The method according to claim 5, wherein the thickness of the first portion is two times the thickness of each of the at least two second portions.

7. The method according to claim 1, wherein the at least two second portions of the patterned photoresist layer are removed by an oxygen or ozone ashing process.

8. A thin film transistor (TFT) comprising:

a gate formed on a substrate;

a gate insulation layer covering the gate and the substrate;

a channel layer formed on the gate insulation layer and corresponding to the gate;

an etching stopping layer located on the channel layer; and a source and a drain respectively coupled to the channel layer;

wherein the channel layer comprises two first sides and two second sides;

each of the two first sides is located opposite each other, each of the two second sides is located opposite each other, and each of the two first sides connects between the two second sides; the two first sides couple with the source and the drain, respectively; the two first sides are not covered by the etching stopping layer, and the two second sides are covered by the etching stopping layer; an unfilled space is defined at each of the two second sides, each of the unfilled spaces is defined by one of the two second sides, a corresponding edge of the etching stopping layer, and a corresponding one of the source and the drain.

9. The TFT according to claim 8, wherein the channel layer and the etching stopping layer are formed in a same photo etching process.

10. The TFT according to claim 8, wherein the channel layer is made of metal oxides.

11. An array substrate comprising:

a plurality of gate lines and a plurality of data lines intersected with each other to define a plurality of pixel areas;

a plurality of pixel electrodes, each of the pixel electrodes located in a corresponding pixel area; and a plurality of thin film transistors (TFTs), each of the TFTs coupled to a corresponding pixel electrode of the plurality of pixel electrodes and comprising:

a gate formed on a substrate;

a gate insulation layer covering the gate and the substrate; a channel layer formed on the gate insulation layer and corresponding to the gate;

an etching stopping layer located on the channel layer; and a source and a drain respectively coupled to the channel layer;

wherein the channel layer comprises two first sides and two second sides;

each of the two first sides is located opposite each other, each of the two second sides is located opposite each other, and each of the two first sides connects between the two second sides; the two first sides couple with the source and the drain, respectively; the two first sides are not covered by the etching stopping layer, and the two second sides are covered by the etching stopping layer;

an unfilled space is defined at each of the two second sides, each of the unfilled spaces is defined by one of the two second sides, a corresponding edge of the etching stopping layer, and a corresponding one of the source and the drain.

12. The array substrate according to claim 11, wherein the channel layer and the etching stopping layer are formed in a same photo etching process.

13. The array substrate according to claim 11, wherein the channel layer is made of metal oxides.

* * * * *